United States Patent
Hoffström

(10) Patent No.: US 6,504,095 B1
(45) Date of Patent: Jan. 7, 2003

(54) MODULE COVER ELEMENT

(75) Inventor: Roger Hoffström, Kista (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/493,610

(22) Filed: Jan. 28, 2000

(30) Foreign Application Priority Data

Nov. 23, 1999 (SE) .............................................. 9904240

(51) Int. Cl.⁷ ................................................. H05K 7/20
(52) U.S. Cl. ........................ 174/52.1; 361/690; 361/692
(58) Field of Search .......................... 174/35 R, 35 GC, 174/35 MS, 52.1; 361/816, 818, 690, 692, 694, 704, 707, 709, 748, 752; 257/706, 712

(56) References Cited

U.S. PATENT DOCUMENTS

| | | | | |
|---|---|---|---|---|
| 5,166,772 A | * | 11/1992 | Soldner et al. ............. | 257/659 |
| 5,285,350 A | * | 2/1994 | Villaume .................... | 361/690 |
| 5,557,064 A | * | 9/1996 | Isern-Flecha et al. .. | 174/35 MS |
| 5,639,989 A | * | 6/1997 | Higgins, III ........... | 174/35 MS |
| 5,991,468 A | * | 11/1999 | Murakami et al. .......... | 382/313 |
| 6,023,412 A | * | 2/2000 | Morita ........................ | 361/690 |
| 6,067,230 A | * | 5/2000 | Ashida et al. .............. | 361/704 |
| 6,104,608 A | * | 8/2000 | Casinelli et al. ............ | 361/692 |

FOREIGN PATENT DOCUMENTS

JP 56152254 A * 11/1981 .................. 361/690

* cited by examiner

Primary Examiner—Dean A. Reichard
Assistant Examiner—Carmelo Oliva
(74) Attorney, Agent, or Firm—Burns, Doane, Swecker & Mathis, LLP

(57) ABSTRACT

The present invention relates to a cover element, such as a lid for a module, such as a DC/DC-module and then preferably for a DC/DC-module of the so-called BGA-type. To enable manufacture and handling of DC/DC-modules to be simplified, the modules have been provided with a lid (2). The main purposes of a module lid is to provide a surface which enables the module to be vacuum-plucked and which provides a surface for marking the module and also which provides a certain degree of mechanical protection to the module printed circuit board (1) when handling the module. The lid has partially open sides (5) which enable cool air to pass around the components on the module and which also enable washing and rinsing liquids to be evacuated from the module.

14 Claims, 1 Drawing Sheet

MODULE COVER ELEMENT

This application claims priority under 35 U.S.C. §§119 and/or 365 to 9904240-0 filed in Sweden on Nov. 23, 1999; the entire content of which is hereby incorporated by reference.

FIELD OF INVENTION

The present invention relates to a cover element, such as a module lid, e.g. a DC/DC-module lid, and then preferably a cover element or lid for a BGA-type DC/DC-module.

BACKGROUND OF THE INVENTION

In this document, a DC/DC-module is a direct current converter which is intended to be mounted on a circuit board and which may, itself, comprise a number of smaller components. A comparison is often made between the cost of a module and the cost of the components corresponding to a module if they were mounted directly on a user circuit board. The introduction of surface mounting of modules has resulted in greater demands on the temperature durability of the finished product and the precision of the terminal leads.

Ball Grid Array (BGA) type capsules are a type of capsule or can which are often used for logic circuits and which includes many inputs and outputs, This type of capsule is comprised essentially of carrier parts on which one or more chips are mounted. The upper side of the carrier on which the chip is mounted is usually moulded in a plastic material, for instance an epoxy resin. The underside of the carrier includes terminals that consist of hundreds of solder balls or bumps, which have obtained their form through natural processes when re-melting. When a BGA-type capsule, or "daughter board", is placed on a "mother board" and heated in a remelt oven, the balls melt and wet a corresponding surface on the mother board. The wetting forces ensure that the capsule will not drop too far. A BGA capsule eliminates several of the drawbacks of conventional capsules or cans. A BGA capsule has no terminal leads. Any non-flatness is compensated for by virtue of the capsule falling d own onto the mother board, and no complicated lead bending operations are required.

SUMMARY OF THE INVENTION

In order to simplify the manufacturing of a DC/DC-module, the material used and the manufacturing steps entailed have been minimized with respect to the components necessary for the module, where a DC/DC-module does not require as many input and output signals as a standard BGA-type module. The use of the same basic construction as that of a BGA-type module while building a compete subsystem on the module, in this case a DC/DC-module, would give essentially the same advantages as those afforded by the BGA capsule mentioned above.

In order to further simplify the manufacturing and handling of the DC/DC-module, the module has been provided with a lid. The main purposes of the module lid is to provide a surface for vacuum-plucking of the module, to provide a surface for marking the module, and also to afford mechanical protection when manually handling the module. The lid includes partially open sides through which cool air is able to pass around the module components and which enables washing and rinsing liquids to be evacuated from the module.

When heating DC/DC-modules of the so-called BGA-type that are baked in plastic, moisture may be released from the module board during the process of melting the solder bumps with the intention of achieving connections with underlying contact elements and blow apart the plastic casing. The open construction provided by a lid that has open sides in accordance with the invention enables the module board to be ventilated and therewith eliminate this problem.

The invention will now be described in more detail with reference to a preferred embodiment and also with reference to the accompanying drawing.

BRIEF DESCRIPTION OF TEE DRAWING

FIGS. 1b and 1c are side views of one corner of the lid shown in FIG. 1a.

DESCRIPTION OF PREFERRED EMBODIMENTS

Figure 1A:
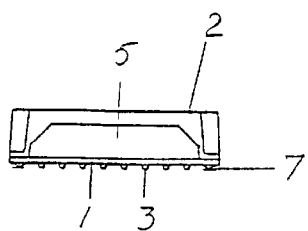
FIG. 1a is a side view of a printed circuit board having a lid constructed in accordance with the invention.
Figure 1B:
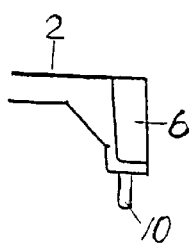
Figure 1C:
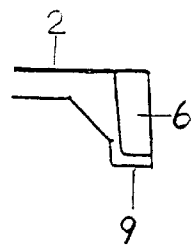
Figure 2:
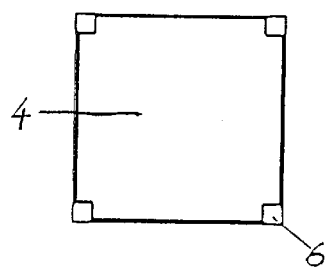
FIG. 2 shows the lid of FIG. 1 from above.
Figure 3:
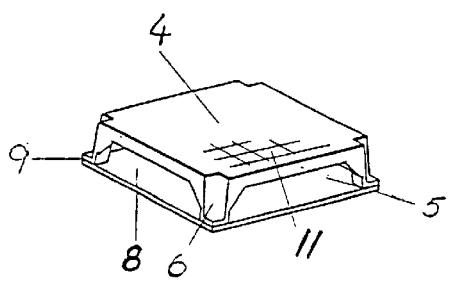
FIG. 3 is a perspective view of the printed circuit board fitted with the lid of FIG. 1.
Figure 4:
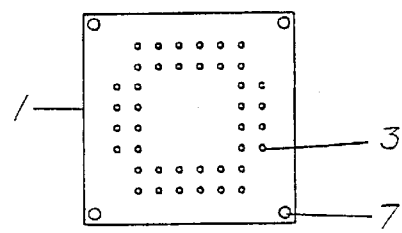
FIG. 4 shows the printed circuit board from beneath.

FIGS. 1–4 illustrate the construction of a module of the DC/DC-type. The module comprises a daughter board/printed circuit board 1 and a lid 2. The module also includes components connected to the printed circuit board, although these are not shown in the Figures. The underside of the printed circuit board carries solder balls or bumps 3 for connecting board-mounted components with underlying contact elements on a mother board. The lid 2 has a planar, generally square upper side 4 which is joined to four partially open sides 5 and four corner elements. These corner elements function as means 6 for fastening the lid on the printed circuit board. Instead of making the underside of the lid is planar, the lid may be partially thinned at its top surface so as to provide room for tall underlying components, wherewith the height of the construction can be minimized by adapting the configuration of the underside of the lid to the vertical sizes of the underlying components. Depending on the field of use, the lid may either be made of a non-conductive material, such as a plastic material, or a conductive material for heat dissipation purposes, for instance. For the purpose of securing the lid to the printed circuit board, each fastener element 6 may include at its lower part a pin 10 or like element that fits in a hole provided in a corner of the circuit board and functioning to fix the pin in said corner and to secure the lid to the circuit board. Alternatively, for the purpose of aligning and securing the fastener elements to the circuit board, the lower parts of said fastener elements may include a planar portion 9 which can be glued to the circuit board. In order to guarantee the correct distance between module/circuit board and underlying contact elements on a mother board and to obtain optimal strength of solder connections made at these locations, the underside of the circuit board may be provided in the corners thereof with spacing elements, such as rivet heads 7. The rivet heads may be produced with the aid of pins whose lengths are adapted so that the pins will protrude from the corner holes when inserted into said holes. The pins are formed directly from the plastic lid material and the rivet heads are formed by deforming or upsetting the protruding ends of said pins, for instance with the aid of an ultrasound process, so as to hold the lid to the circuit board. The formed rivet heads can then be used as spacing elements between the circuit board of the module and the underlying mother board or the like. The planar upper side 4 of the lid enables the assembled module to be moved with the aid of suction, so-called vacuum-plucking. In addition to protecting the underlying components when handling the module, both manually and automatically, the lid can also be used for marking purposes, by applying text and/or symbols to the upper surface of the lid. The lid can also be given a screening function with respect to underlying components, by coating the surface of the lid with a conductive material 11 or by incorporating a conductive material in said lid provided that said conductive material is connected to earth. The partially open sides S of the lid enables cool air to pass by the components on the circuit board beneath the lid, and also enables washing and rinsing liquids to be readily evacuated, This type of lid-fitted module construction also enables the module to be readily handled by surface mounting machines in X-ray tests carried out in relevant quality controls and when mounting said components.

It will be understood that the invention is not restricted to the aforedescribed and illustrated exemplifying embodiment thereof and that modifications can be made within the scope of the accompanying Claims.

What is claimed is:

1. A cover element for a module that contains a printed circuit board, said cover element comprising:
   a flat polygonal planar upper side suitable for vacuum-plucking;
   support members at each corner, wherein said support members extend from and out of said upper side;
   connecting devices at each support member for positioning and securing the cover element to the printed circuit board of the module; and
   open sides between each of the support members, wherein said open sides are arranged to permit gas or liquid to flow between the connecting devices and the printed circuit board of the module.

2. A cover element according to claim 1 further comprising a planar underside.

3. A cover element according to claim 1 further comprising an underside that is adapted to conform to underlying components.

4. A cover element according to claim 1, wherein the connecting device is a pin.

5. A cover element according to claim 4, wherein the pin has a length which enables the pin to pass through the printed circuit board of the module so that the ends of the pin protruding from the underside of the print circuit board can be deformed and therewith affix the lid to said printed circuit board and also so as to provide spacing elements between said module and an underlying mother board.

6. A cover element according to claim 1, wherein the cover element is comprised of a non-conductive material.

7. A cover element according to claim 1, wherein the cover element is comprised of a conductive material.

8. A cover element according to claim 1, wherein the cover element is comprised of an insulating material that has been provided with a screen.

9. A lid for a direct current converter (DC/DC) module that contains a printed circuit board, said lid comprising:
   a flat polygonal planar upper side suitable for vacuum-plucking;
   support members at each corner, wherein said support members extend from and out of said upper side;
   connecting devices at each support member for positioning and securing the lid to the printed circuit board of the module; and
   open sides between each of the support members, wherein said open sides are arranged to permit gas or liquid to flow between the connecting devices and the printed circuit board of the module.

10. The lid of claim 9, wherein said DC/DC-module is a ball grid array type DC/DC-module.

11. The lid of claim 10, further comprising a planar underside.

12. The lid of claim 10 further comprising an underside that is adapted to conform to underlying components.

13. The lid of claim 10, wherein each connecting device is a pin.

14. The lid of claim 13, wherein the pin has a length which enables the pin to pass through the circuit board so that the ends of the pin protruding from the underside of the circuit board can be deformed and therewith affix the lid to said circuit board and also so as to provide spacing elements between said circuit board and an underlying mother board.

* * * * *